United States Patent
Yang et al.

(10) Patent No.: US 6,969,642 B2
(45) Date of Patent: Nov. 29, 2005

(54) METHOD OF CONTROLLING IMPLANTATION DOSAGES DURING CODING OF READ-ONLY MEMORY DEVICES

(75) Inventors: Ta Hung Yang, Hsinchu (TW); Tien Chu Yang, Hsinchu (TW); Tsung Hsien Wu, Hsinchu (TW); Chunghsien Lee, Hsinchu (TW); Kuo Chuang Hui, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 49 days.

(21) Appl. No.: 10/627,026

(22) Filed: Jul. 25, 2003

(65) Prior Publication Data

US 2005/0020016 A1    Jan. 27, 2005

(51) Int. Cl.[7] .............................................. H01L 21/82
(52) U.S. Cl. ...................... 438/130; 438/276
(58) Field of Search .................... 438/130, 275, 438/276, 277, 278, 289, 636

(56) References Cited

U.S. PATENT DOCUMENTS

| | | | |
|---|---|---|---|
| 5,378,649 A * | 1/1995 | Huang | 438/278 |
| 5,707,765 A | 1/1998 | Chen | 430/5 |
| 5,854,110 A * | 12/1998 | Kunitou | 438/276 |
| 6,022,644 A | 2/2000 | Lin et al. | 430/5 |
| 6,397,377 B1 | 5/2002 | Wang et al. | 716/21 |
| 6,417,548 B1 | 7/2002 | Sheu et al. | 438/275 |
| 6,420,235 B1 | 7/2002 | Wang | 438/276 |
| 6,436,772 B2 | 8/2002 | Otsuki | 438/278 |
| 2001/0051418 A1 * | 12/2001 | Otsuki | 438/128 |

* cited by examiner

Primary Examiner—Chandra Chaudhari
(74) Attorney, Agent, or Firm—Stout, Uxa, Buyan & Mullins, LLP

(57) ABSTRACT

A method of controlling implantation dosages during coding of read-only memory (ROM) devices is disclosed. According to the method, a semi-manufactured ROM device having a plurality of gates with identically designed gate widths is formed, followed by the formation of a first photoresist layer over the semi-manufactured ROM device. The first photoresist layer is selectively exposed to develop a pattern of pre-code openings, with each pre-code opening being positioned over a word line and between two adjacent bit lines intersecting the word line and with the pre-code openings having substantially identical sizes. A second photoresist layer is then formed over the first photoresist layer, followed by selectively exposing the second photoresist layer to develop a pattern of real-code openings therein, with the real-code openings having substantially identical sizes. A tuned dosage of ions is then implanted through intersections of the real-code and pre-code openings to thereby code the ROM device.

39 Claims, 7 Drawing Sheets

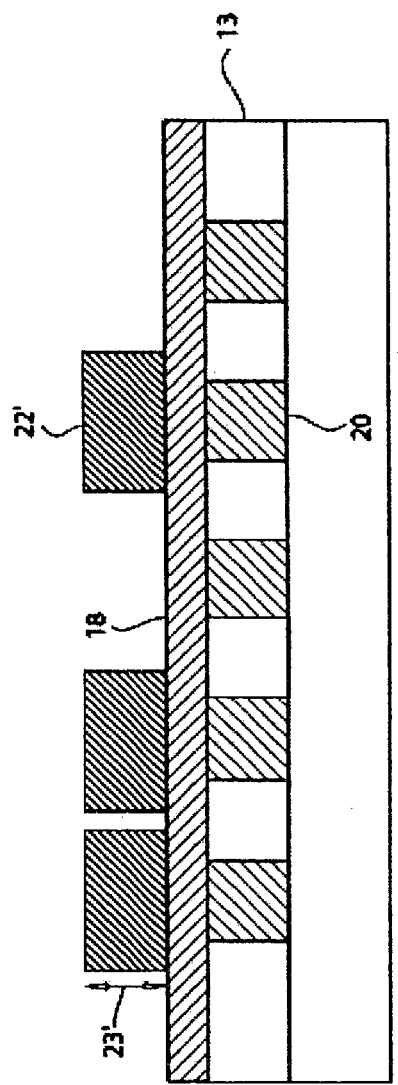
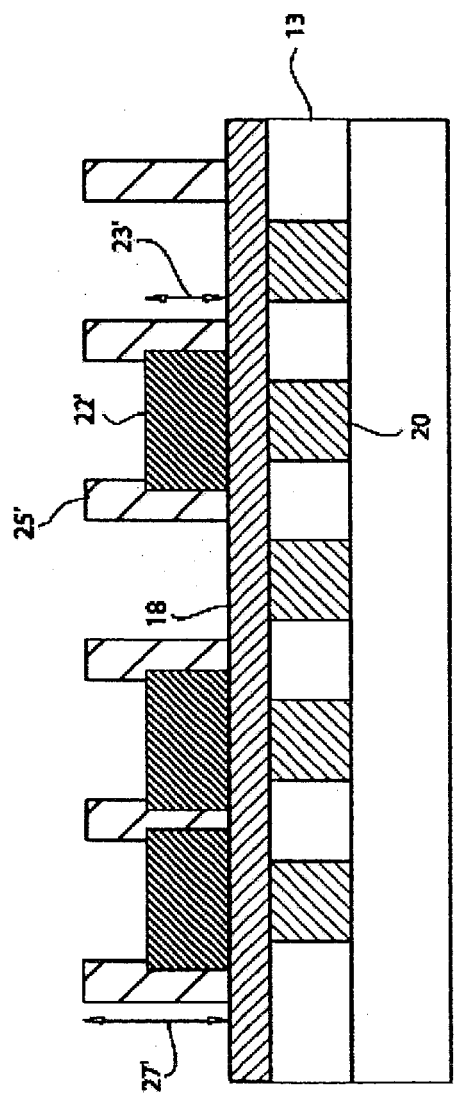
FIG. 6a
FIG. 6b

METHOD OF CONTROLLING IMPLANTATION DOSAGES DURING CODING OF READ-ONLY MEMORY DEVICES

BACKGROUND OF THE INVENTION

1. Field of the Invention

The present invention relates to non-volatile memory devices and, more particularly, to methods of code programming read-only memory (ROM) semiconductor devices.

2. Description of Related Art

A non-volatile, semiconductor memory device is designed to securely hold data even when power is lost or removed from the memory device. The read-only memory (ROM) is a non-volatile memory device widely used in microprocessor-based digital electronic equipment for storing predetermined programs.

Arrays of memory cells are conventionally disposed in ROM devices for storing data, wherein each memory cell includes a transistor. These transistors, which typically comprise metal-oxide-semiconductor field effect transistors (MOSFETs), are disposed at intersecting bit lines and word lines of the memory device. Data bit values or codes held by these memory cell transistors are permanently stored in the physical or electrical properties of the individual memory cells. Generally speaking, a consequence of the non-volatile nature of a ROM is that data stored in the memory device can only be read.

The fixation of this "read-only" data into the ROM is performed during a code programming process at the original manufacture or fabrication of the memory device. Code programming a ROM typically entails ion implanting the read-only data into transistor channel regions of selected memory cells of the memory, thereby increasing the threshold voltage at which the MOSFET activates. The threshold voltage can be increased such that it is greater than the maximum possible applied voltage. This results in a permanently nonconductive or less conductive transistor, and thereby codes a binary "0" into the implanted MOSFET.

Since the channel regions of only selected memory-cell transistors are ion implanted, other areas of the memory device should be covered and protected during the ion-bombardment step. Accordingly, code photomasks have been developed in the prior art for permitting the implantation of ions only into selected regions of the semiconductor. Usage of code photomasks during the code programming process has lead to the characterization of these memory devices as mask ROMs.

Regarding code photomasks, these tools for facilitating code programming of the mask ROM operate using principles of photolithography. Photolithography is a method of transferring a pattern onto a substrate so as to create structures down to the scale of fractions of a micron. A photolithography process can be incorporated, for example, in the fabrication of many modern devices such as MEMS (micro-electro-mechanical systems), optics, and semiconductor devices including mask ROMs.

A typical optical photolithographic process is implemented by depositing onto a substrate such as a semiconductor wafer, by some means (usually a spinner), a layer of photosensitive resist which can be patterned by exposure to ultraviolet (UV) light or another radiation type. To undergo exposure, the photoresist covered wafer is placed beneath a photomask designed to prevent the penetration of radiation through certain portions of the photoresist. Predetermined areas of the photoresist then undergo a degree of polymerization or depolymerization, which can be a function of the nature and extent of photoresist exposure to the radiation. A chemical bath known as a developer can then be used to dissolve parts of the photoresist which remain depolymerized after the radiation by placing the wafer therein and allowing the wafer to be rinsed for a designated time period. Having received the pattern from the photomask, the layer of photoresist on the wafer is typically referred to as a layer of patterned photoresist.

A patterned photoresist layer can be created either on a bare wafer or on a number of previously generated layers of a wafer, with a limitation that the layer or layers should have somewhat planar surfaces to avoid problems including depth of focus variances. Common uses for patterned photoresist include selectively doping certain areas of a wafer while preventing other protected areas from being implanted, and selectively etching underlying layers on a substrate. When used as an implantation barrier, the patterned photoresist can prevent the underlying protected areas from receiving dopant, thereby allowing electrical properties of the substrate to differ between sites.

Code photomasks can be divided into the categories of pre-code masks and real-code masks. Pre-code masks provide dense identical patterns of openings, each of which defines a transistor. Real-code masks provide openings only for those transistors that are to be programmed.

In the practice of code programming ROMs, numerous methods exist by which the desired code can be implanted in the ROM. Two common coding methods both of which are utilized allegedly to minimize processing time and reduce the number of processing stages are used with equal aplomb. The first method involves forming a photoresist layer, and subsequently twice exposing the photoresist layer, once with the pre-code pattern and once with the real-code pattern. In this method a single photoresist plane is used for two exposures, making it difficult to control the overlay of the two exposures. As a result, an undesirable shifting of the implantation area may occur.

Another common coding method uses only a single mask (the real-code mask) for ion implantation, forgoing the pre-code mask. The real code is formed by a mask image on a single photoresist plane. This method requires a minimum of processing steps, however, since a pre-code mask is not utilized it can be difficult to control the actual sizes of the various processing windows (open areas). This can result in a reduced control over the ion dosage received by individual transistors at different locations on the ROM.

As an alternative solution which may avoid the aforementioned difficulties, prior-art photolithography approaches occasionally utilize an oxide layer in combination with one or more photoresist layers. Implementation of an oxide layer as the pre-code mask may achieve desired implanting goals in accordance with circuit fabrication objectives without many of the above-discussed problems. Known shortcomings, however, are presented in connection with fabrication processes utilizing oxide layers. For instance, further processing steps are required to pattern the oxide layers, which steps can lead to increased processing times, consumption of additional materials, and augmented costs. Undesirable particles can also be introduced during the oxide deposition and during the oxide patterning process. Furthermore, implementation of an oxide pre-code masking process may induce a critical dimension (CD) bias, and may cause etch uniformity related issues. Imprecise CD control during formation of a pre-code pattern in an oxide layer can adversely affect the real-code implantation process. In the context of mask ROM fabrication and coding, it is desirable to code program the memory devices as quickly and simply as possible, with a minimal expenditure of resources and a minimal risk of adverse particle introduction and CD bias.

A need thus exists in the prior-art for methods of manufacturing mask ROMs in which more accurate dosage control and processing windows can be obtained, while providing minimal processing times and materials, to thereby reduce defects and maintain a low cost. A need also exists for reliable code programming methods which can decrease the potential for particle contamination during the pre-code steps. Furthermore, with device sizes approaching the resolution limit of optical photolithography, wherein, for example, a code implantation area may be 0.15 um$^2$, a need continues in the prior-art to exercise precise pre-code and real-code CD control to thereby maintain device performance in a cost effective manner.

SUMMARY OF THE INVENTION

The present invention addresses these needs by providing, in accordance with one aspect, non-volatile memory coding structures and methods for making the same which can be fast, clean, controlled, and simple in construction. The invention disclosed herein provides a method of code programming a mask read-only memory (ROM), wherein a photoresist is placed over word lines of the ROM and patterned to thereby form the ROM pre-code pattern directly in the photoresist. A second layer of photoresist is then formed and subsequently patterned to generate ROM real-code openings for facilitating a subsequent code-programming implantation step. The real-code pattern and pre-code pattern overlap vertically and lie at different photoresist planes.

To achieve these and other advantages and in accordance with an aspect of the present invention, as embodied and broadly described herein, the invention provides a method of code programming a ROM device in which substantially identical implantation dosage occurs for a plurality of codes. In one implementation of the present invention the method comprises forming at least one semi-manufactured ROM device having a plurality of gates with identically designed gate widths, forming a first photoresist layer over the semi-manufactured ROM device, selectively exposing the first photoresist layer to develop a pattern of pre-code openings, each pre-code opening being substantially identically sized and being positioned over a word line and between two adjacent bit lines intersecting the word line, forming a second photoresist layer over the first photoresist layer, selectively exposing the second photoresist layer to develop a pattern of real-code openings therein, each real-code opening having substantially identical sizes, and implanting a tuned dosage of ions through intersections of the real-code and pre-code openings. Subsequent to patterning the first photoresist layer, the first photoresist layer may be hardened, wherein hardening comprises implanting the first photoresist layer with a tuned dosage, or processing the first photoresist layer in a plasma etcher.

In accordance with one aspect of the invention, the gate widths do not necessarily need to be substantially identically sized, the pre-code openings do not necessarily need to be substantially identically sized, and the real-code openings do not necessarily need to have substantially identical sizes, so long as openings formed by the intersections of the real-code and pre-code openings are the same size to thereby facilitate substantially identical implantation doses being delivered to the selected channels. An anti-reflective coating may optionally be formed before the formation of the first photoresist layer.

In accordance with another aspect of the present invention, the pre-code openings may be established by forming an oxide layer over the plurality of gates, forming a first patterned photoresist layer over the oxide layer, etching the oxide layer, and then removing the first patterned photoresist layer. A second patterned photoresist layer may then be formed over the oxide layer. A sacrificial layer may be formed subsequent to removing the first patterned photoresist layer, and then planarized. After forming the second patterned photoresist layer, exposed portions of the sacrificial layer may be removed.

In accordance with another aspect of the present invention, a method for code programming a ROM device in which substantially identical implantation dosage occurs for a plurality of codes comprises forming at least one semi-manufactured ROM device having a plurality of gates with substantially identically designed gate widths, forming a first photoresist layer over the semi-manufactured ROM device, selectively exposing the first photoresist layer to develop a pattern of real-code openings, each real-code opening having a substantially identical size, forming a second photoresist layer over the first photoresist layer, selectively exposing the second photoresist layer to develop a pattern of pre-code openings therein, each pre-code opening also having a second substantially identical size, and implanting a tuned dosage of ions through intersections of the real-code and pre-code openings.

According to one aspect of the present invention at least one opening of the pattern of real-code openings may overlay at least one pre-code opening. The real-code openings may be fewer in number than the pre-code openings. The pre-code openings may have a width greater than the gate widths, and the real-code openings may be larger than, of equal size to, or smaller than the pre-code openings.

In accordance with another aspect of the present invention the forming of the first photoresist layer, patterning of the first photoresist layer, forming of the second photoresist layer, patterning of the second photoresist layer, and code implanting of the ROM device may be repeated in whole or in part to achieve desired threshold voltages among the channels of the gates. The first photoresist layer may have a first thickness, the second photoresist layer may have a second thickness, and the second thickness may be greater than the first thickness.

In one implementation of the present invention the substrate may comprise a semiconductor substrate having a P type background, the bit lines may be formed of an N type impurity, and implanted impurities in the substrate between adjacent bit lines may be of a P type impurity. The plurality of codes may comprise substantially all of the codes, the at least one semi-manufactured ROM device may comprise a plurality of semi-manufactured ROM devices, and the plurality of gates may comprise substantially all gates of the semi-manufactured ROM device.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE DRAWINGS

FIG. 6a is a cross-sectional view of the configuration of FIG. 2 with the addition of a patterned photoresist layer in accordance with another embodiment;

FIG. 6b is the cross-sectional view of the configuration of FIG. 6a, with the addition of another patterned photoresist layer;

DETAILED DESCRIPTION OF THE PRESENTLY PREFERRED EMBODIMENTS

Figure 1:
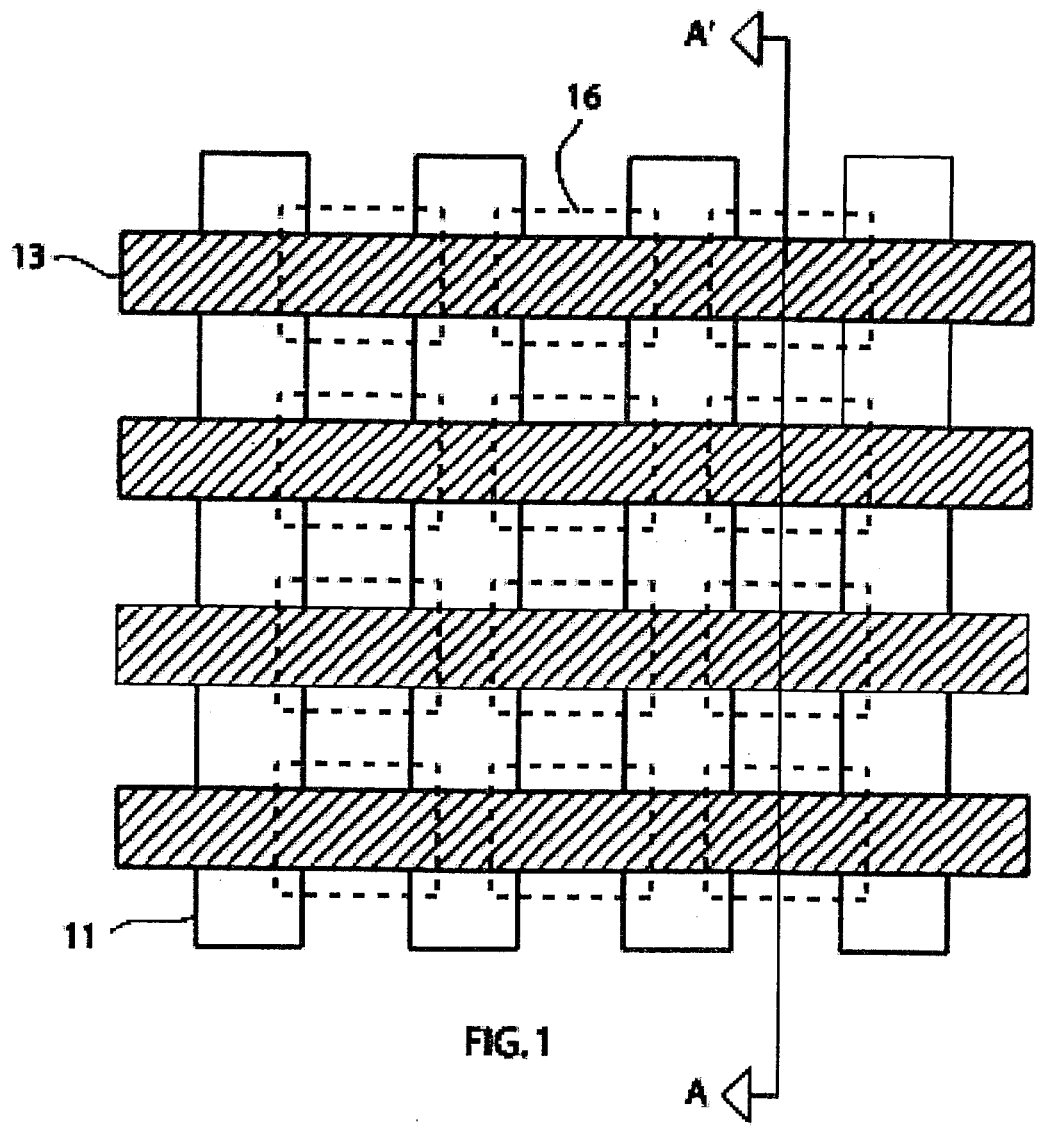
FIG. 1 is a plan view of a ROM device after word lines have been formed.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as, top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims.

For example, it is understood by a person of ordinary skill in the art that the pre-code and real-code patterns formed by the methods of the present invention may be formed in NMOS, PMOS, CMOS and bipolar devices, to provide effective ion implantation in high density memory cells, such as memory cells with critical dimensions that are similar to physical limits of optical photolithography processes.

It is to be understood and appreciated that the process actions and structures described herein do not cover a complete process flow for the manufacture of memory devices. The present invention may be practiced in conjunction with various integrated circuit fabrication and coding techniques that are conventionally used in the art, and only so much of the commonly practiced process actions are included herein as are necessary to provide an understanding of the present invention.

Double photoresist layers in accordance with the present invention have been discovered to be particularly applicable in facilitating the fabrication and code programming of non-volatile semiconductor memory devices. A number of non-volatile semiconductor memory devices require code programming at the time of their manufacture. During the code programming of many of these memory devices, memory cells in the form of metal-oxide-semiconductor field effect transistors (MOSFETs) are ion implanted, wherein impurities are introduced into the MOSFETs to change their electrical characteristics. For instance, in the case of a non-volatile memory device in the form of a mask-programmable read-only memory (ROM) device, code programming can be accomplished by introducing impurities into the channel regions of selected MOSFETS to thereby increase their threshold voltages.

Referring more particularly to the drawings, FIG. 1 illustrates a mask ROM array disposed on a semiconductor substrate and having a plurality of orthogonally arranged bit lines 11 and word lines 13. The bit lines 11 are formed before the word lines 13 in the illustrated embodiment. In this embodiment, the substrate can comprise a background impurity type, and the bit lines 11 can be parallel formed therein by implantation of an impurity type opposite the background impurity type. For instance, the substrate can have a P-type background impurity type and the bit lines can be formed using N-type dopant, such as Arsenic or Phosphorous, ion implantation.

After formation of the bit lines 11, a gate oxide layer (not shown) is preferably formed on the substrate to a thickness of about 50 to about 300 Angstroms and patterned to form in the illustrated embodiment a plurality of substantially identically designed gates, positioned in an array and having substantially identical, and preferably the same, widths. The gate oxide can be grown using a thermal oxide process, which is preferentially performed in a chemical vapor deposition (CVD) furnace.

A conductive layer is then deposited by, for example, CVD, wherein the conductive layer has a grain size sufficient to exhibit desirable electrical properties. A photoresist is spun over the conductive layer and patterned by exposure to ultraviolet (UV) radiation. The pattern projected onto the photoresist is that of a plurality of parallel strips. An etch process is used to transfer the pattern into the conductive layer by etching back exposed portions of the conductive layer. The photoresist is subsequently removed to reveal a plurality of memory cell word lines 13, which are parallel to one another and orthogonal to the bit lines 11. These word lines 13, which preferably comprise a conductive material such as polysilicon, can be formed using low pressure chemical vapor deposition (LPCVD). As presently embodied, the bit lines 11 and the word lines 13 can have widths of about 0.16 microns or less, and the word lines 11 can be spaced apart by about 0.16 microns or less.

The bit lines 11 and word lines 13 in combination form MOSFET memory cells 16, which are exemplarily indicated by phantom rectangles in the figure. More particularly, a MOSFET memory cell 16 is defined at each intersection of a word line 13 and two bit lines 11. The bit lines 11 on the sides of each MOSFET memory cell 16 serve as source/drain regions, and the part of the word line 13 disposed between the source and drain regions serves as the gate of the MOSFET memory cell 16.

The MOSFET memory cells 16, which can be accessed via the corresponding bit lines 11 and word lines 13 to which they are connected, hold the data (or code) of the mask ROM. When a MOSFET memory cell 16 is accessed, a voltage applied at its gate by the word line 13 will either be higher or lower than a threshold voltage required for the gate to facilitate conduction between the source/drain bit lines 11. If the applied gate voltage is at or higher than the threshold voltage, the MOSFET memory cell 16 is turned on permitting a logic "1" value to be read; otherwise the MOSFET memory cell 16 is not turned on and a logic "0" value is read from the MOSFET memory cell 16.

When the channel of a given MOSFET memory cell 16 is ion implanted, its voltage threshold can be increased so that it will have a logic "0" value. The channel of a given MOSFET memory cell 16 to be implanted is located in the substrate under the word line 13 and between the adjacent bit lines 11. As distinguished from ion-implanted cells, non-implanted MOSFET memory cells 16 will have a logic "1" value and continue to conduct when potentials are applied to their gates via the word lines 13. The mask ROM can thus be programmed using ion implantation to change the logic values of selected MOSFET memory cells 16 from logic "1" values to logic "0" values.

Properly masking the channel regions of MOSFET memory cells 16 that are not to be implanted is a critical step in the code programming process. According to one aspect of the present invention, double layers of patterned material are used to shield the MOSFET memory cells 16 that are to hold a logic "1" value within the mask ROM from implanting. Regarding these double patterned layers, they preferably comprise photoresist which can be employed for photolithographic purposes as either positive photoresist, negative photoresist, or combinations thereof. Positive photoresist, also known as light-softening photoresist, can be depolymerized by exposure to radiation such as Lw light. Therefore, with positive photoresist, areas exposed to radiation are dissolved upon placement in a developer, while the masked, unexposed areas remain unaffected. On the other hand, negative photoresist, which is a light-hardening photoresist, can be polymerized by exposure to radiation, meaning that the exposed areas remain, while the covered areas are dissolved. Thus, depending on the type of photoresist utilized, the pattern transferred to the photoresist on the wafer is either a positive or a negative image of the photomask pattern.

Figure 2:
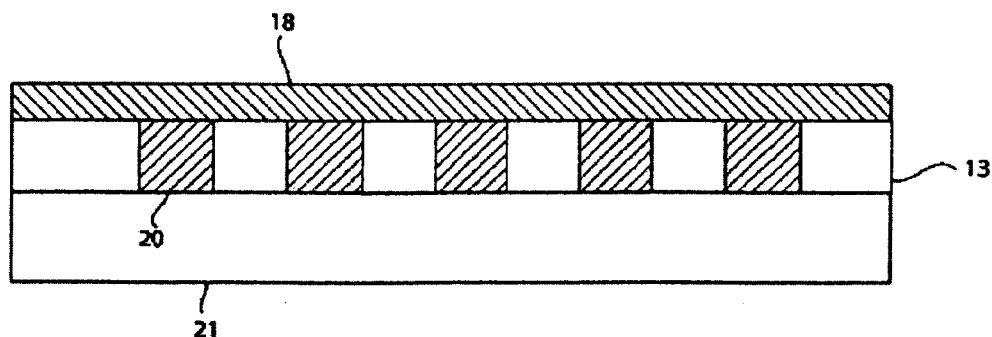
FIG. 2 is a cross-sectional view of a ROM device in an intermediate processing stage in accordance with the present invention.

In reference to FIG. 2, a cross-sectional view of a semi-manufactured ROM device (i.e., a ROM device that is in an intermediate processing stage) in accordance with the present invention, taken along line A–A' of FIG. 1, is provided, wherein the sectional view is shown from the substrate on-up for simplicity. In other words, the sectional view of FIG. 2 does not show the gate oxide layer on the substrate and the implanted bit lines within the substrate. Gate widths 20 are shown within the word line 13 over a prepared substrate 21. Each illustrated gate width 20 represents the area of the underlying gate oxide (not shown).

A bottom anti-reflective coating (BARC) 18 is disposed above word line 13. The BARC 18 is highly absorbent, and preferably absorbs most of the radiation penetrating the photoresist, thereby reducing any reflective notching, standing wave effects and scattering of the radiation. In the illustrated embodiment, the BARC 18 comprises anti-reflective coating materials standard in the art and suitable for the presently described applications.

Figure 3A:
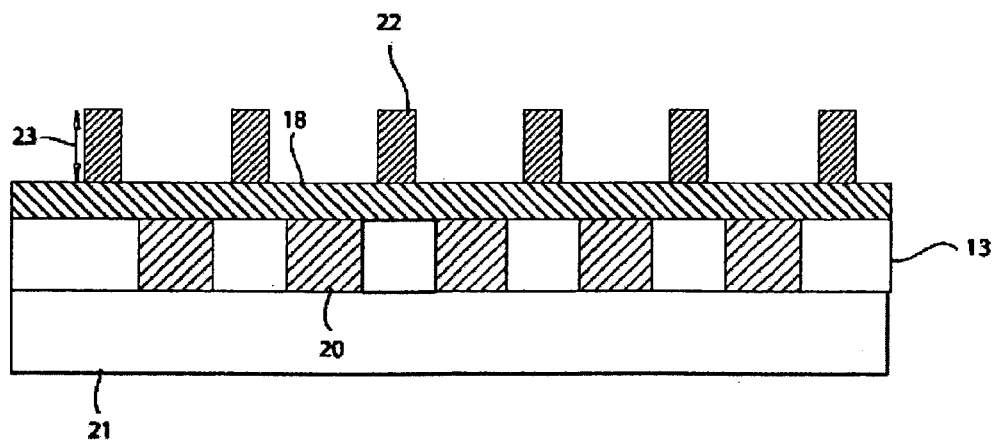
FIG. 3a is a cross-sectional view of the configuration of FIG. 2, in which a first patterned photoresist layer has been formed.

Referring to FIG. 3a, a spinner is utilized to deposit a first photoresist layer 22 over the BARC 18. According to a feature of the invention, this first photoresist layer 22 can be selected from the negative or positive photoresist categories. In the case of a positive photoresist, the photomask that must be selected is then a positive image of the final desired pattern, whereas in the case of a negative photoresist the photomask must be a negative image of the final desired pattern. As presently embodied, the first photoresist comprises positive photoresist, due to for example improved resolution, such as resist UV3 manufactured by Shipely or SEP203 manufactured by Shin-Etsu, which may be deposited, for example, to a thickness 23 of about 0.3 um to about 0.7 um, and in a preferred embodiment to a thickness of about 0.41 um as selected from a swing curve. The thickness range selection can be based upon a trade-off between implantation resistance and resolution. A thicker resist may provide better prevention against undesired ion implantation, but may reduce resolution.

A pre-code pattern is then projected by a stepper or mask aligner onto the wafer, according to the photomask used. During process development a NA of 0.7 and a Sigma of 0.85/0.55 (off-axis illumination) may be used for maximized or suitable depth of focus and resolution. The pre-code pattern is a dense pattern of processing windows, each of which in the illustrated embodiment is substantially identical, and preferably the same, in size and shape. The processing windows are preferably larger than the designated gate width along the gate width direction to thereby for example increase the efficacy of the newly-coded conjunctions between source and drain regions and/or increase the coding yield. In one embodiment the critical dimension for the pre-code processing windows is 0.19 um. In modified embodiments, each processing window can be the same or about the same size as the designated gate width along the gate width direction. By providing substantially identically patterned processing windows for each ROM cell, the pre-code pattern assures that substantially identical, and preferably the same, implant doses will be achieved among ROM cells. A developer is subsequently used to dissolve the unpolymerized photoresist. The pre-code pattern defined by the photomask, corresponding to a dense series of exposed and unexposed areas, is therefore transferred onto the first layer of photoresist 22. As presently embodied, the pre-code pattern describes all of the possible MOSFET memory cell 16 windows which will be available for coding in a subsequent real-code programming step.

Following the pre-code patterning of the first photoresist layer 22, the first photoresist can be treated with at least one of a treatment implant and a treatment plasma from a plasma etcher, to thereby harden the first photoresist layer 22 and render it resilient to and, preferably, functionally impervious to subsequent photolithographic processing. The hardening process operates by creating a cross-linked pattern within the photoresist polymer, for example during ion implantation. A treatment of Argon (Ar) ion implantation can create a hard skin along the outer layer of the first photoresist, and to some depth within the first photoresist. Proper integrity through subsequent processing steps can be maintained by proper tuning of the implantation dose and energy during the hardening process.

Figure 3B:
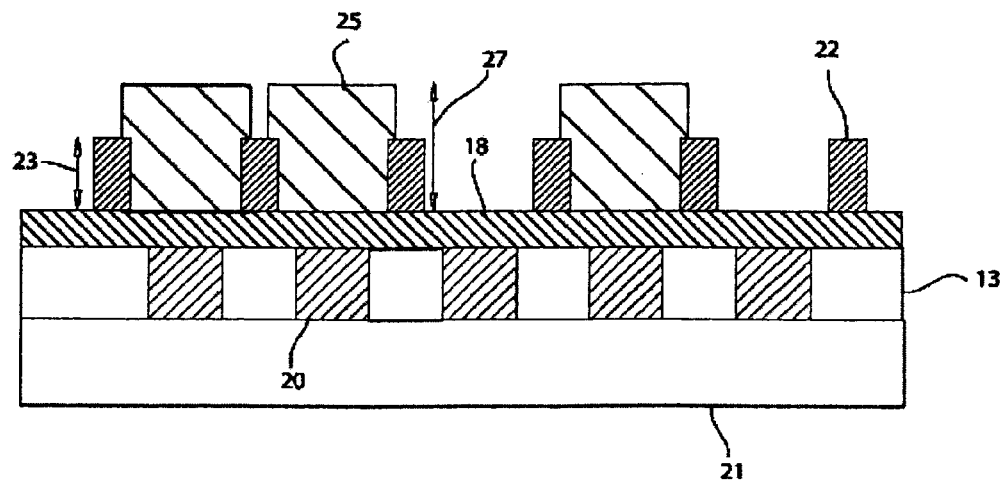
FIG. 3b is the cross-sectional view of FIG. 3a, wherein a second patterned photoresist layer has been formed.

Referring to FIG. 3b, a second layer of photoresist 25 is thereafter spun directly over the patterned first photoresist layer 22 to a thickness 27 of about 0.3 um to about 0.7 um, and in a preferred embodiment to a thickness of about 0.5 um as selected from a swing curve. As with the first photoresist layer 22, the thickness range selection can be based upon a trade-off between implantation resistance and resolution. Also, as with the first photoresist layer 22 according to a feature of the invention, this second photoresist layer 25 can be selected from the negative or positive photoresist categories. As presently embodied, the second photoresist comprises a positive photoresist, due to for example improved resolution, such as resist UV3 manufactured by Shipely and SEPR203 manufactured by Shin-Etsu. After selection and application of the real-code photomask the second layer of photoresist 25 is then patterned using conventional means, preferably using an NA of 0.56 and a sigma of 0.406 (conventional illumination) during process development, to a critical dimension of 0.27 um. The depolymerized photoresist is subsequently dissolved by placement of the wafer into a chemical bath of developer.

Photoresists comprise combinations of photo sensitive polymers and solvents. Without implementing a hardening process on a first patterned photoresist layer, applying and patterning a second photoresist layer over the first can cause deformation of the first photoresist layer as a result of for example solvent of the second photoresist interacting with the first photoresist (even if the first photoresist had been exposed and/or baked). A resist hardening step is thus implemented in accordance with the present invention to prevent harmful pattern deformation. The hardened first photoresist layer 22, having been cured in such a way to make it substantially impervious to solvents and UV radiation, retains its structural integrity during development of the second photoresist layer 25.

FIG. 3b shows a cross-sectional view of the second photoresist layer 25 disposed directly over areas of the first photoresist layer 22 and the BARC 18. The open areas (processing windows) defined by the second photoresist layer 25 can have substantially identical, and preferably the same, sizes, and may be larger, smaller, or of identical size to open areas defined by the first photoresist layer 22. In the illustrated embodiment, the open areas defined by the second photoresist layer 25 are slightly larger than open areas defined by the first photoresist layer 22. The open areas defined by the second photoresist layer 25 overlap (i.e., intersect) at least one of the open areas defined by the first photoresist layer 22. As presently embodied, there are fewer open areas defined by the second photoresist pattern than by the first photoresist pattern. In accordance with an aspect of the invention, the second photoresist layer 25 determines only the location selection of ROM cells to be programmed, and does not offer any form of dosage control. In combination with the first photoresist layer 22, the second photoresist layer 25 determines which MOSFET memory cells 16 will have a logic "1" value and which memory cells will have a logic "0" value. In the illustrated embodiment, the channel regions of MOSFET memory cells 16 which are to be programmed with a "0" receive an implant, while the MOSFET memory cells 16 which are to be programmed with a "1" receive no implant so that their threshold voltages remain unchanged.

Figure 4:
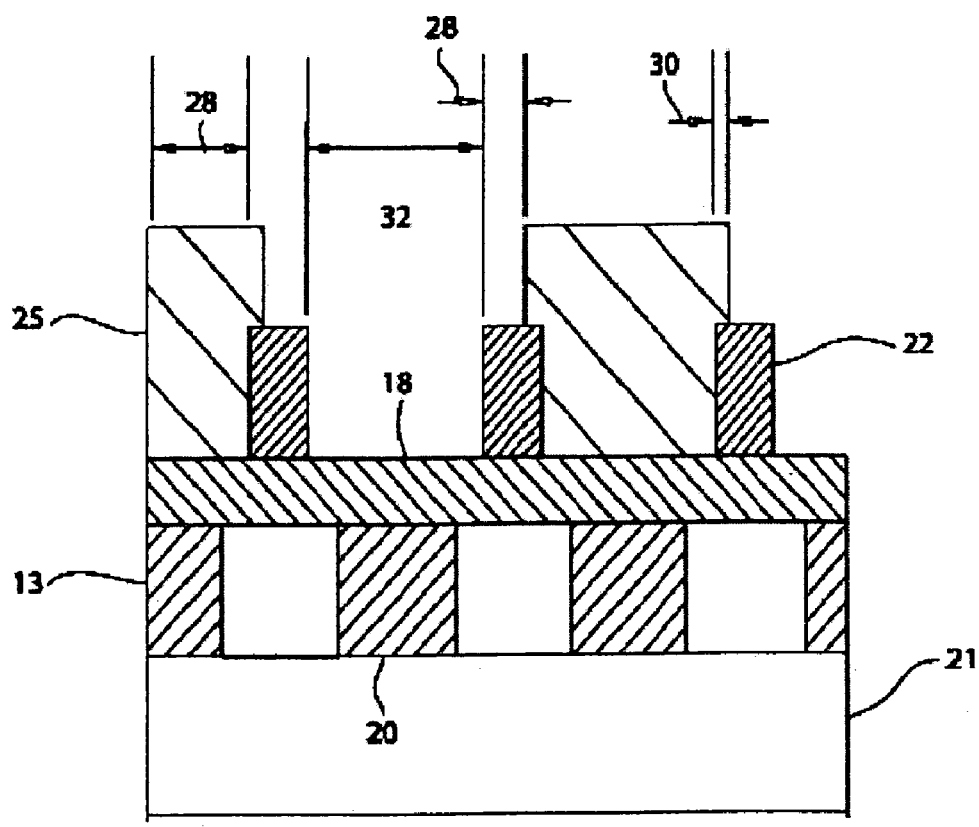
FIG. 4 is a zoomed in cross-sectional view of the device of FIG. 3b.

FIG. 4 shows an expanded view of a portion of FIG. 3b, in which there exists a first layer of photoresist 22 and a second layer of photoresist 25. The first photoresist layer 22 has a pattern, and the second photoresist layer 25 has a pattern, the two patterns being separate and unique from one another. Regions 28 on the wafer may exist which are covered by only the fist photoresist layer 22 or only the second photoresist layer 25, while other regions 30 may exist and be covered by both the first photoresist layer 22 and the second photoresist layer 25. Further still, the regions 32, which correspond to both the pre-code openings of the first photoresist layer 22 and the real-code openings of the second photoresist layer 25, remain exposed for future processing. These regions 32 correspond to and allow for the implantation of dopants to the underlying channel regions of the MOSFET memory cells 16 that are to be programmed with a logic "0" value.

Areas left exposed by the pre-code and real-code photoresist layers 22 and 25, respectively, are thus implanted in the illustrated embodiment with a tuned ion dosage through substantially identically sized open areas 32. In the illustrated embodiment wherein the bit lines are N-type regions, a P-type boron ion can be used for the code implants. The boron ions are implanted at energies sufficient to facilitate penetration thereof through the BARC layer 18, the word line 13 and the gate oxide layer, and into the selected channel regions of the substrate. After the wafer has been code implanted, both layers of photoresist can be removed. The first photoresist layer can be readily removed by conventional $O_2$ ashing. In the illustrated embodiment, no additional steps are required to remove the two photoresist layers than are normally used to remove a single layer of photoresist.

Figure 5:
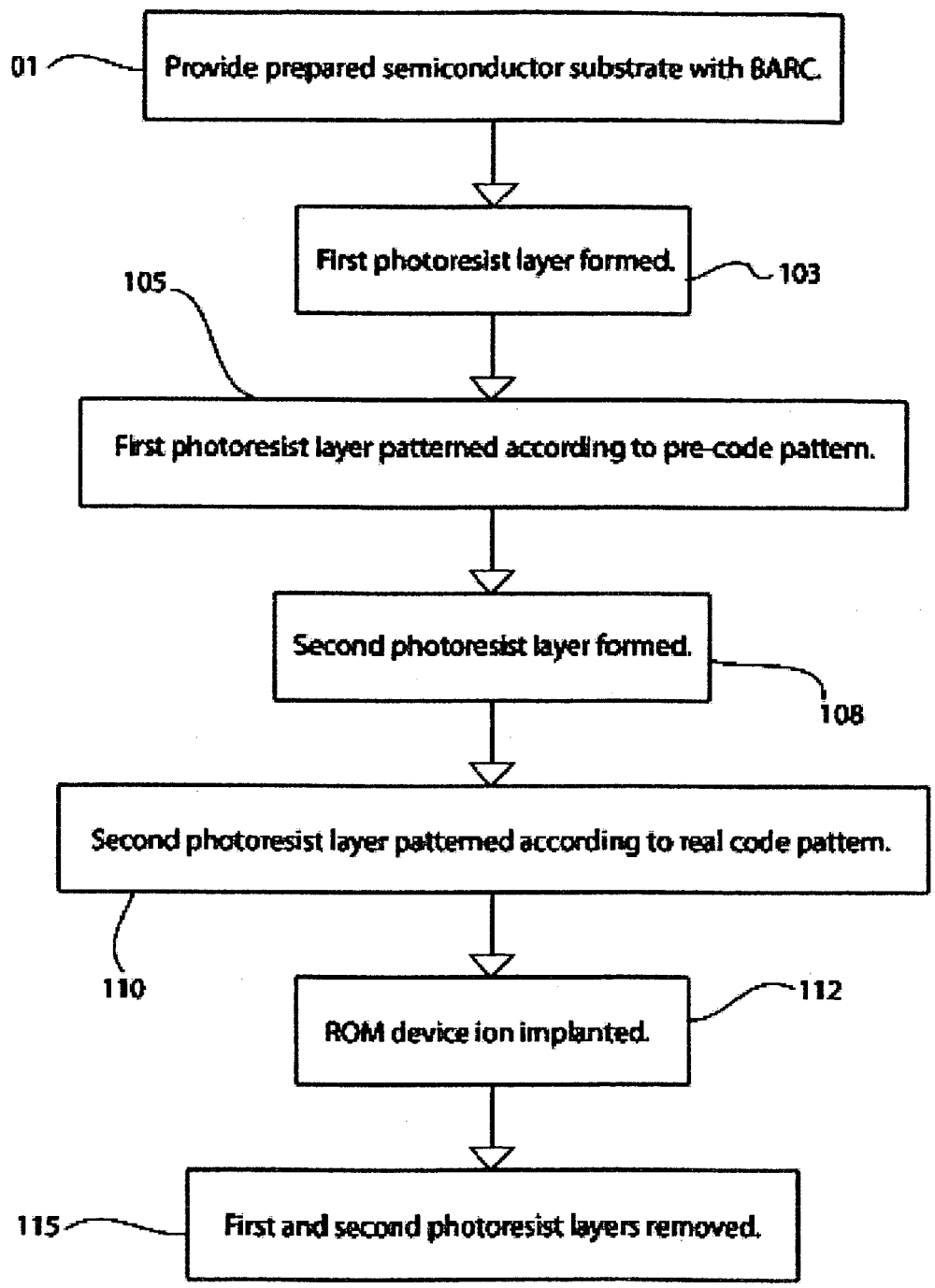
FIG. 5 is a flow chart representing processing actions for coding a ROM device in accordance with an embodiment of the present invention.

Turning now to FIG. 5, a process flow chart is provided setting forth steps for coding cells of a ROM device in accordance with an embodiment of the present invention. This method begins at step 101 by providing a prepared semiconductor substrate 21 on which a BARC 18 has been deposited. At step 103 a first photoresist layer 22 is formed to a desired thickness. At step 105 the first photoresist layer 22 is patterned according to a pre-code pattern of substantially identically sized openings, each defining a single memory cell 16 of the ROM device and being larger than the gate width in the gate width direction. In step 108 a second photoresist layer 25, which may be of the same or different photoresist type as the first photoresist layer 22, is formed over the prepared substrate and the first photoresist layer 22. The thickness of the second photoresist layer 25 may be substantially greater than the thickness of the first photoresist layer. Step 110 follows in which a real-code pattern is transferred to the second photoresist layer 25, the real-code pattern having fewer openings than the pre-code pattern, each real-code opening of which is substantially identical to the others. The openings of the real-code pattern may be larger, smaller, or of equal size to openings defined by the pre-code pattern. At step 112 the ROM device is ion implanted to program exposed open areas. The coding method may end with step 115, in which the first and second photoresist layers, 22 and 25, respectively, are removed using standard ash and clean procedures.

A preferred embodiment has been described wherein a first layer of photoresist 22 is patterned over word lines of a non-volatile memory device. The photoresist pattern conforms to a pre-code photoresist pattern for the creation of mask-programmable ROMs. The pre-code pattern exposes all of the channels of cell regions on the wafer that might be coded (implanted). In accordance with one aspect of the invention, the wafer comprising the first layer of photoresist 22 may then be stored for future coding.

Subsequently, the wafer may be retrieved from storage. A second photoresist layer 25 can then be spun on, which may comprise positive or negative photoresist. The real-code pattern of the second photoresist layer 25 can be determined by a customer's order, the pattern of the second photoresist layer 25 being necessarily different from the first layer pattern 22. Thus, while the first photoresist layer exposes all of the areas that are possible to code, the second photoresist layer 25 exposes only those layers that are to be coded, e.g., with a value of "0", for the particular device being created. The exposed areas are then implanted, and both layers of photoresist are removed by for example first performing a dry strip and then a wet strip.

In accordance with an alternative embodiment of the present invention, referring back to FIG. 2, a BARC 18 is disposed above word line 13 onto prepared semiconductor substrate 21. Continuing to FIG. 6a a first photoresist layer 22' that may be substantially similar in composition to the first photoresist layer 22 in the preferred embodiment is deposited using a spinner onto the BARC 18 to a thickness 23'. A real-code pattern is then projected by a stepper or mask aligner onto the wafer, according to the photomask used. Processing windows presented by the real-code pattern may be substantially identical in size and may have greater widths than the gate widths. A developer is subsequently used to dissolve depolymerized or non-polymerized photoresist. The first photoresist layer 22' may subsequently be hardened.

As illustrated in FIG. 6b a spinner is thereafter used to deposit a second photoresist layer 25' directly over the first photoresist layer 22' and regions of the BARC 18 to a thickness 27', which is substantially thicker than thickness 23'. The second photoresist layer 25' may be selected from either the positive or negative photoresist categories. The pre-code mask pattern is then projected onto the second photoresist layer 25'. The resultant pre-code pattern is an array of openings, substantially identical in size and shape, each disposed above a ROM cell and in the illustrated embodiment wider than the gate width. The ROM device is subsequently ion implanted, and, thereafter, both layers of photoresist are removed.

Figure 7:
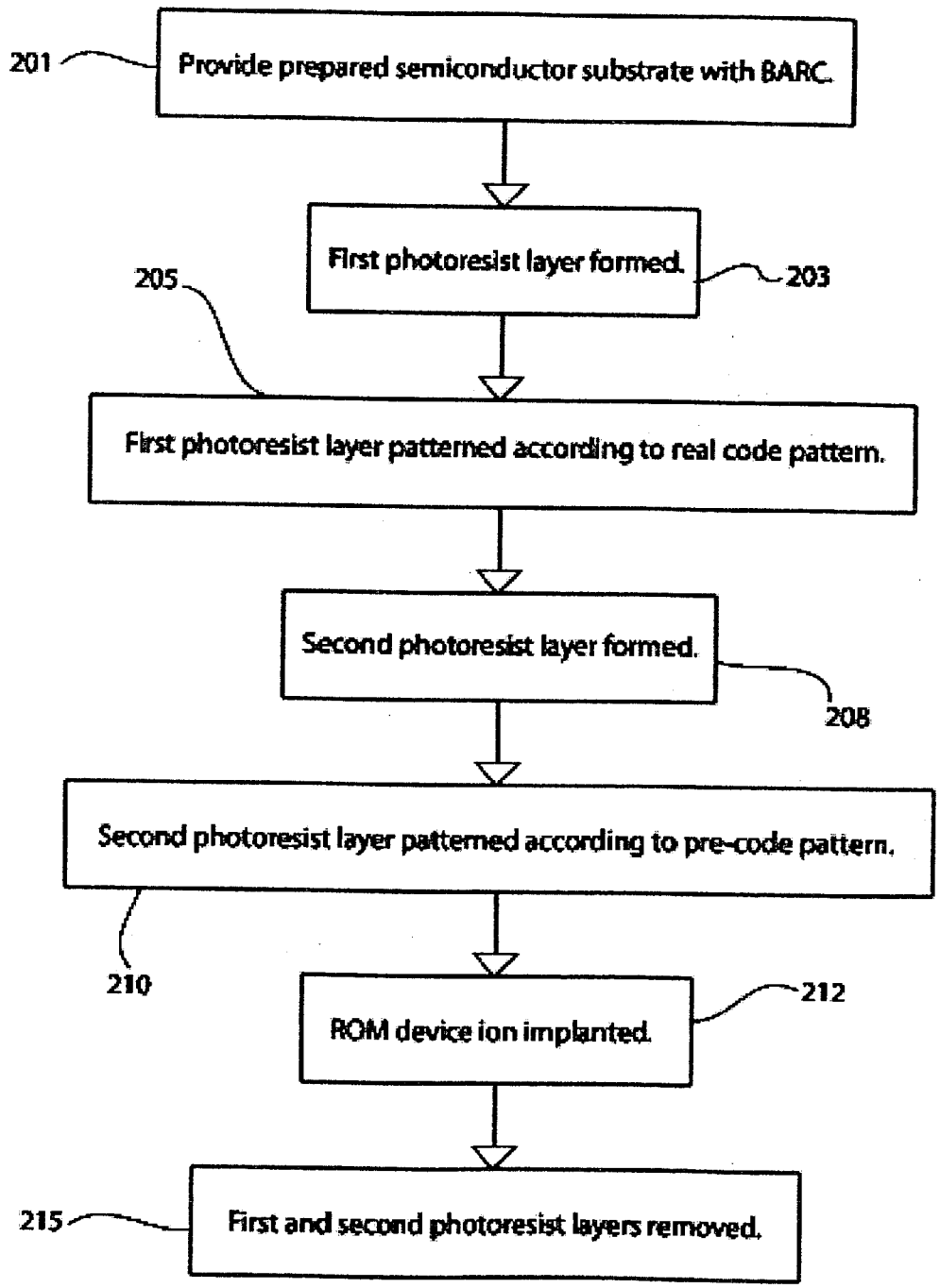
FIG. 7 is a flow chart representing processing steps for coding a ROM device in accordance with an embodiment of the present invention.

With reference to FIG. 7 a process flow chart illustrates steps for coding cells of a ROM device in accordance with the embodiment of FIGS. 6a and 6b. This method begins at step 201 by providing a prepared semiconductor substrate 21 on which a BARC 18 has been deposited. At step 203 a first photoresist layer 22' is formed to a desired thickness. At step 205 the first photoresist layer 22' is patterned according to a real-code pattern of openings substantially identical in size, and preferably wider than the gate width. In step 208 a second photoresist layer 25', which may be of the same or different photoresist type as the first photoresist layer 22', is formed over the prepared substrate 21 and the first photoresist layer 22'. The thickness of the second photoresist layer 25' may be substantially greater than the thickness of the first photoresist layer 22'. Step 210 follows in which a pre-code pattern is transferred to the second photoresist layer 25', the pre-code pattern having a number of openings greater than the real-code pattern. At step 212 the ROM device is ion implanted to program exposed open areas. The coding method may end with step 215, in which the first and second photoresist layers, 22' and 25' respectively, are removed by standard ash and clean procedures.

In accordance with another aspect of the present invention, the first layer of photoresist 22 or 22' is constructed to have a thickness and composition sufficient to protect underlying substrate features (e.g., bit lines and/or adjacent channels), which are not to be implanted, from harmful implantation during the subsequent code programming process. For example, inadvertent code implantation into a bit line 11 can increase the resistance of the bit line 11 due to the opposite impurity types. Accordingly, no patterned layers, having dimensions sufficient to block the subsequent code implant of the ROM or semiconductor device, need be present between the first photoresist layer and the word line 13. Similarly, no patterned layers sufficient to block the subsequent code implant of the ROM or semiconductor device need be present between the first photoresist layer and the ARC layer.

The forming of the first photoresist layer 22 or 22', patterning of the first photoresist layer, forming of the second photoresist layer 25 or 25', patterning of the second photoresist layer, and implanting of the ROM device may be repeated to achieve desired threshold voltages.

In modified embodiments, the openings of the first photoresist layer 22 or 22' do not necessarily need to be substantially identically sized and the openings of the second photoresist layer 25 or 25' do not necessarily need to have substantially identical sizes, so long as openings formed by the intersections of the real-code and pre-code openings are substantially the same size to thereby facilitate substantially identical, and preferably the same, implantation doses being delivered to the selected channels.

Figure 8:
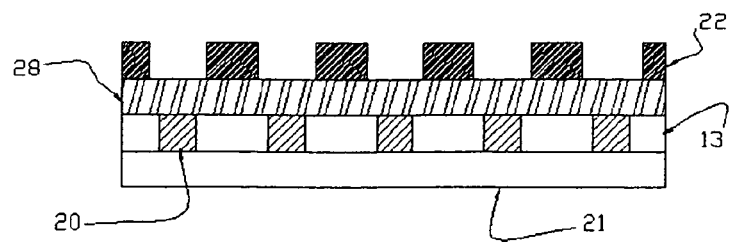
FIG. 8 is a cross-sectional view of a ROM device in an intermediate processing stage in which a first patterned photoresist layer has been formed, according to another embodiment of the present invention.
Figure 9:
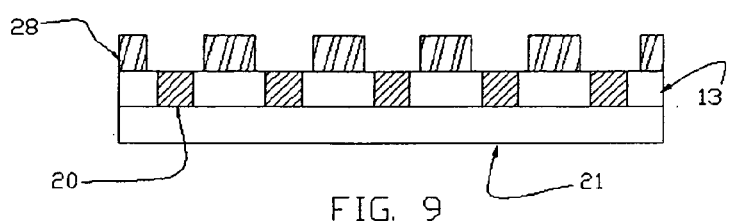
FIG. 9 is a cross-sectional view of FIG. 8 following etching of an underlying oxide layer and removal of the first patterned photoresist.

In accordance with another aspect of the present invention, when the openings of the real-code pattern are smaller than the openings of the pre-code pattern, a sacrificial layer may be formed on the ROM device after the first photoresist layer 22 or 22' has been patterned with a pre-code pattern or a real-code pattern, respectively. With reference to FIG. 8, the gate widths 20 are shown within the word line 13 over a prepared substrate 21. An oxide layer 28 is disposed above the word line 13. A first photoresist layer 22 disposed above the oxide layer 28 has been exposed with a pre-code pattern and developed. Turning to FIG. 9, the oxide layer 28 has been etched by a dry or wet etch process and the first photoresist layer 22 has been removed, projecting the pre-code pattern onto the oxide film.

Figure 10:
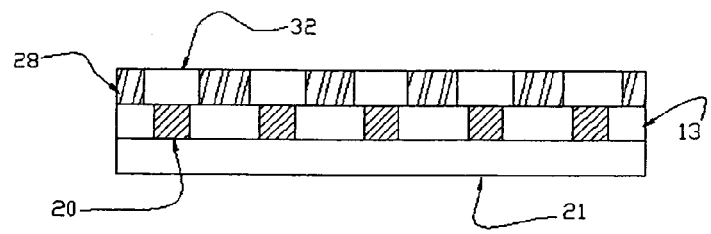
FIG. 10 is a cross-sectional view of FIG. 9 following formation of a sacrificial layer between features of the etched oxide layer.
Figure 11:
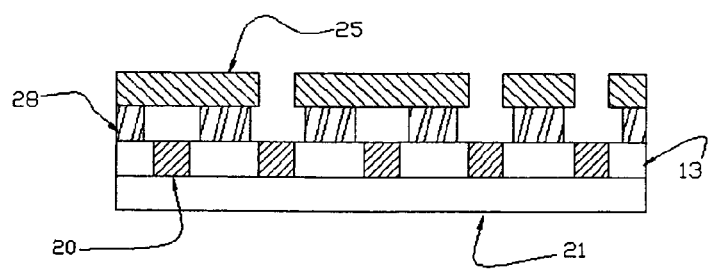
FIG. 11 is a cross-sectional view of FIG. 10 following mask etching of selected portions of the sacrificial layer.
Figure 12:
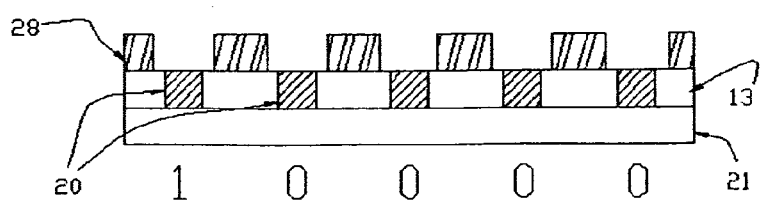
FIG. 12 is a cross-sectional view of FIG. 11 following code implanting and removal of photoresist, oxide, and sacrificial layer portions, to form a series of MOSFET memory cells.

As depicted in FIG. 10, a sacrificial layer 32, which may comprise, for example, spin on glass (SOG), is subsequently deposited over the oxide layer 28 and word line 13. The sacrificial layer 32 is then planarized by, for example, chemical mechanical polishing (CMP) or by etch back to yield the construction of FIG. 10. The second photoresist layer 25 may then be applied over the oxide layer 28 and the sacrificial layer 32 and patterned with the real-code pattern. Areas of the sacrificial layer 32 that are left exposed by the real-code pattern are subsequently removed by, for example, a buffered oxide etch, as shown in FIG. 11. Following removal of exposed areas of the sacrificial layer 28, areas of the word line 13 that are left exposed by the pre-code pattern and by the real-code pattern are implanted with a tuned ion dosage. After the wafer has been code implanted, the second photoresist layer 25, the oxide layer 28, and remaining portions of the sacrificial layer 32 can be removed. The resultant structure is a series of MOSFET memory cells 16 which have logical values of either "1" or "0" accordingly as shown in FIG. 12. This approach can offer an advantage of increasing the mis-alignment budget (amount of allowed mis-alignment between the real-code and pre-code pattern), with the trade off of a smaller critical dimension for the real-code pattern.

In view of the foregoing, it will be understood by those skilled in the art that the methods of the present invention can facilitate formation and code programming of read only memory devices in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A method of code programming a ROM device in which predetermined cells are coded with substantially identical implantation doses, the method comprising:
    (a) forming at least one semi-manufactured ROM device having a plurality of gates;
    (b) forming a pattern of pre-code openings, the pre-code openings having widths, measured in a gate width direction, that are greater than widths of gates over which the pre-code openings are formed;
    (c) forming a pattern of real-code openings over the pattern of pre-code openings; and
    (d) implanting a tuned dosage of ions through intersections of the real-code openings and the pre-code openings.

2. The method as set forth in claim 1, wherein:
    the plurality of gates have substantially identically designed gate widths;
    each pre-code opening is positioned over a word line and between two adjacent bit lines intersecting a word line; and
    intersections between the real-code openings and pre-code openings have substantially identical openings.

3. The method as set forth in claim 2, wherein:
    the pre-code openings have substantially identical sizes;
    the real-code openings have substantially identical sizes; and
    the real-code openings are fewer in number than the pre-code openings.

4. The method as set forth in claim 3, wherein:
    the step of forming a pattern of pre-code openings comprises forming a first photoresist layer over the semi-manufactured ROM device and selectively exposing the first photoresist layer to develop the pattern of pre-code openings; and
    the step of forming a pattern of real-code openings comprises forming a second photoresist layer over the first photoresist layer and selectively exposing the second photoresist layer to develop the pattern of real-code openings.

5. The method as set forth in claim 4, further comprising the step of:
    hardening the first photoresist layer subsequent to forming the pattern of pre-code openings.

6. The method as set forth in claim 5, wherein hardening the first photoresist layer comprises implanting the first photoresist layer with a tuned dosage or processing the first photoresist layer in a plasma etcher.

7. A method of code programming a ROM device in which predetermined cells are coded with substantially identical implantation doses, the method comprising:
    (a) forming at least one semi-manufactured ROM device having a plurality of gates, the plurality of gates having substantially identically designed pate widths;
    (b) forming a pattern of pre-code openings, each pre-code opening being positioned over a word line and between two adjacent bit lines intersecting a word line, and the pre-code openings having substantially identical sizes, the pre-code openings having widths, measured in a gate width direction, that are greater than widths of gates over which the pre-code openings are formed;
    (c) forming a pattern of real-code openings over the pattern of pre-code openings, and the real-code openings having substantially identical sizes, and the real-code openings being fewer in number than the pre-code openings; and
    (d) implanting a tuned dosage of ions through intersections of the real-code openings and the pre-code openings, intersections between the real-code openings and pre-code openings having substantially identical openings.

8. The method as set forth in claim 7, wherein the real-code openings have sizes greater than the pre-code openings.

9. The method of claim 8, wherein (c) and (d) are repeated in accordance with desired threshold voltages.

10. The method as set forth in claim 7, wherein the real-code openings and the pre-code openings have substantially the same sizes.

11. The method of claim 7, wherein the real-code openings are smaller in size than the pre-code openings.

12. A method of code programming a ROM device in which predetermined cells are coded with substantially identical implantation doses, the method comprising:
    (a) forming at least one semi-manufactured ROM device having a plurality of gates, the plurality of gates having substantially identically designed gate widths;
    (b) forming a pattern of pre-code openings, each pre-code opening being positioned over a word line and between two adjacent bit lines intersecting a word line, and the pre-code openings having substantially identical sizes, wherein forming the pre-code openings comprises forming an oxide layer over the plurality of gates, forming a first photoresist layer patterned with the pre-code pattern over the oxide layer, and etching the oxide layer and removing the first photoresist layer;
    (c) forming a pattern of real-code openings over the pattern of pre-code openings, and the real-code openings having substantially identical sizes, and the real-code openings being fewer in number than the pre-code openings; and
    (d) implanting a tuned dosage of ions through intersections of the real-code openings and the pre-code openings, intersections between the real-code openings and pre-code openings having substantially identical openings.

13. The method as set forth in claim 12, wherein the method further comprises the steps of:
    after removing the first photoresist layer, forming a sacrificial layer over the pre-code pattern; and
    planarizing the sacrificial layer.

14. The method as set forth in claim 13, wherein planarizing the sacrificial layer is performed by CMP or by etch back.

15. The method as set forth in claim 13, wherein exposed portions of the sacrificial layer are removed after forming the real-code openings.

16. The method as set forth in claim 3, wherein (a) further includes forming an antireflective coating.

17. The method as set forth in claim 3, wherein:
the substantially identical implantation doses are the same, the substantially identically designed gate widths are the same; the pre-code opening sizes are the same, and the real-code opening sizes are the same; and
channels of gates underneath the intersecting real-code and pre-code openings receive the same doses of ions at (d) through identically sized openings of the pattern of pre-code openings; and
channels of gates not underneath the intersecting real-code and pre-code openings do not receive doses of ions at (d).

18. The method as set forth in claim 3, wherein the at least one semi-manufactured ROM device comprises a plurality of semi-manufactured ROM devices and the plurality of gates comprises substantially all gates of the semi-manufactured ROM device.

19. The method as set forth in claim 3, wherein between (b) and (c) the ROM structure is stored and then retrieved for additional processing.

20. A ROM device formed using the method of claim 3, wherein the pattern of pre-code openings and the pattern of real-code openings overlap vertically and are disposed on different planes.

21. A method of code programming a ROM device in which predetermined cells are coded with substantially identical implantation doses, the method comprising:
(a) forming at least one semi-manufactured ROM device having a plurality of gates with substantially identically designed gate widths;
(b) forming a pattern of real-code openings;
(c) forming a pattern of pre-code openings thereafter; and
(d) implanting a tuned dosage of ions through intersections of the pre-code openings and the real-code openings, the intersections having substantially identical sizes.

22. The method as set forth in claim 21, wherein:
each real-code opening is substantially identically sized relative to the other real-code openings;
the pre-code openings have substantially identical sizes; and
the real-code openings are fewer in number than the pre-code openings.

23. A method of code programming a ROM device in which predetermined cells are coded with substantially identical implantation doses, the method comprising:
(a) forming at least one semi-manufactured ROM device having a plurality of gates with substantially identically designed gate widths;
(b) forming a pattern of real-code openings, each real-code opening being substantially identically sized relative to the other real-code openings, the forming a pattern of real-code openings comprising forming a first photoresist layer over the semi-manufactured ROM device and selectively exposing the first photoresist layer to develop the pattern of real-code openings;
(c) forming a pattern of pre-code openings therein, the pre-code openings having substantially identical sizes, wherein the real-code openings are fewer in number than the pre-code openings, the forming a pattern of pre-code openings comprising forming a second photoresist layer over the first photoresist layer and selectively exposing the second photoresist layer to develop the pattern of pre-code openings;

(d) implanting a tuned dosage of ions through intersections of the pre-code openings and the real-code openings, the intersections having substantially identical sizes.

24. The method as set forth in claim 23, further comprising the step of:
hardening the first photoresist layer subsequent to forming the pattern of pre-code openings.

25. The method as set forth in claim 24, wherein hardening the first photoresist layer comprises implanting the first photoresist layer with a tuned dosage or processing the first photoresist layer in a plasma etcher.

26. A method of code programming a ROM device in which predetermined cells are coded with substantially identical implantation doses, the method comprising:
(a) forming at least one semi-manufactured ROM device having a plurality of gates with substantially identically designed gate widths;
(b) forming a pattern of real-code openings, each real-code opening being substantially identically sized relative to the other real-code openings;
(c) forming a pattern of pre-code openings therein, the pre-code openings having substantially identical sizes, wherein the real-code openings are fewer in number than the pre-code openings, the pre-code openings having widths, measured in a gate width direction, that are greater than widths of gates over which the pre-code openings are formed; and
(d) implanting a tuned dosage of ions through intersections of the pre-code openings and the real-code openings, the intersections having substantially identical sizes.

27. The method as set forth in claim 26, wherein the real-code openings have sizes greater then the pre-code openings.

28. The method of claim 27, wherein (b), (c) and (d) are repeated in accordance with desired threshold voltages.

29. The method as set forth in claim 26, wherein the real-code openings and the pre-code openings have substantially the same sizes.

30. The method of claim 29, wherein (b), (c) and (d) are repeated in accordance with desired threshold voltages.

31. The method of claim 26, wherein the real-code openings are smaller in size than the pre-code openings.

32. A method of code programming a ROM device in which predetermined cells are coded with substantially identical implantation doses, the method comprising:
(a) forming at least one semi-manufactured ROM device having a plurality of gates with substantially identically designed gate widths;
(b) forming a pattern of real-code openings, each real-code opening being substantially identically sized relative to the other real-code openings;
(c) forming a pattern of pre-code openings therein, the pre-code openings having substantially identical sizes, wherein the real-code openings are fewer in number than the pre-code openings; and
(d) implanting a tuned dosage of ions through intersections of the pre-code openings and the real-code openings, the intersections having substantially identical sizes, wherein forming the pre-code openings comprises the steps of:
forming an oxide layer over the plurality of gates;
forming a first photoresist layer patterned with the pre-code pattern over the oxide layer; and
etching the oxide layer and removing the first photoresist layer.

33. The method as set forth in claim 32, wherein the method further comprises the steps of:
   after removing the first photoresist layer, forming a sacrificial layer over the pre-code pattern; and
   planarizing the sacrificial layer.

34. The method as set forth in claim 33, wherein planarizing the sacrificial layer is performed by CMP or by etch back.

35. The method as set forth in claim 22, wherein (a) further includes forming an antireflective coating.

36. The method of claim 22, wherein:
   the substantially identical implantation doses are the same, the substantially identically designed gate widths are the same; the pre-code opening sizes are the same, and the real-code opening sizes are the same; and
   channels of gates underneath the intersecting real-code and pre-code openings receive the same doses of ions at (d) through identically sized openings of the pattern of pre-code openings; and
   channels of gates not underneath the intersecting real-code and pre-code openings do not receive doses of ions at (d).

37. A ROM device formed using the method of claim 36, wherein the pattern of real-code openings and the pattern of pre-code openings overlap vertically and lie at different photoresist planes.

38. The method as set forth in claim 22, wherein the at least one semi-manufactured ROM device comprises a plurality of semi-manufactured ROM devices, and the plurality of gates comprises substantially all gates of the semi-manufactured ROM device.

39. The method as set forth in claim 33, wherein exposed portions of the sacrificial layer are removed after forming the real-code openings.

* * * * *